United States Patent [19]

Hartz, Jr.

[11] 4,070,744
[45] Jan. 31, 1978

[54] WASHER ALIGNING AND PLACING TOOL

[75] Inventor: Lewis C. Hartz, Jr., Simpsonville, Md.

[73] Assignee: The United States of America as represented by the Secretary of the Army, Washington, D.C.

[21] Appl. No.: 705,851

[22] Filed: July 16, 1976

[51] Int. Cl.² .............................................. B23P 19/04
[52] U.S. Cl. ........................................ 29/241; 29/747; 29/757; 29/759
[58] Field of Search .................... 29/241, 203 J, 203 P, 29/203 S, 200 J, 747, 757, 759

[56] References Cited

U.S. PATENT DOCUMENTS

| | | | |
|---|---|---|---|
| 1,399,875 | 12/1921 | Pritchett | 29/241 X |
| 1,893,538 | 1/1933 | Ederer | 29/241 UX |
| 2,087,481 | 7/1937 | Roby et al. | 29/241 X |
| 2,214,814 | 9/1940 | Hambleton | 29/241 X |
| 2,355,643 | 8/1944 | Grover | 29/203 P |
| 3,129,494 | 4/1964 | Perkins | 29/241 X |
| 3,307,253 | 3/1967 | Wullenwaber | 29/241 X |
| 3,468,024 | 9/1969 | Yonkers | 29/629 |
| 3,653,122 | 4/1972 | Powell | 29/203 S |
| 3,719,989 | 3/1973 | Fagerstrom et al. | 29/241 |

Primary Examiner—James L. Jones, Jr.
Assistant Examiner—J. T. Zatarga
Attorney, Agent, or Firm—John R. Utermohle; Thomas O. Maser; Barry N. Young

[57] ABSTRACT

A hand tool particularly adapted for the rapid and efficient assembly of large numbers of annular devices such as solder washers onto a plurality of uniformally spaced pins. The invention allows for the vertical stacking of one or more washers onto each pin, without the need for the tedious handling of each washer individually. The working structure is housed in a closable case to allow for operation by hand in a shaking motion without spilling the washers.

5 Claims, 6 Drawing Figures

WASHER ALIGNING AND PLACING TOOL

BACKGROUND OF THE INVENTION a. Field of the Invention

This invention relates to apparatus useful in the assembly of certain types of devices, for example, hand-wired printed circuit boards.

b. Description of the Prior Art

It is common in the art of printed circuit board wiring to utilize a multi-pin connector including a base upon which are mounted a plurality of electrically conducting pins, the pins being regularly spaced and mounted perpendicular to the base. A standard practice is to construct printed circuit boards having a plurality of holes extending therethrough, the holes being regularly spaced to coincide with the spacing of the pins on the connector. Electrical connections are made between the board and the connector by mounting the board upon a connector, hand placing one or more solder washers over the pins extending through the holes to be electrically connected, and passing a heat source over the board and connector to melt the solder. In such a wiring process, it is commonly required to place two solder washers on each pin of the connector, with 70 or more pins to each connector. Thus, it is necessary to place 140 or more of the solder washers by hand and one at a time for each connector used. Because the solder washers are commonly quite small, on the order of 0.075 inches outside diameter and 0.020 inches thick, the hand placing of the washers is a very precise and tedious process. Obviously, the labor associated with such an operation greatly increases the cost of building such a circuit.

SUMMARY OF THE INVENTION

It is an object of this invention to provide a tool which will accurately and quickly position a large number of components such as solder washers onto the connecting pins of a wiring circuit.

It is a further object to provide such a tool which will place a predetermined number of components such as solder washers onto each pin.

It is a still further object to provide such a tool having the further advantages of portability, low cost construction, and ease of use at a wiring workbench.

An apparatus having these and other objects, and appropriate for the assembly of components each having a hole therethrough, onto the pins of a structure having a plurality of pins positioned in a predetermined manner on a base, may include: a jig having extending therethrough a plurality of apertures positioned in an identical pattern to the pins, the apertures being sufficiently large to admit the components, a slidably removable element shaped to fit below the jig and to prevent the components from falling through the apertures, means for randomly scattering the components over the surface of the jig until each aperture is filled with at least one of the components, and means for removing the element, thereby allowing the components within said apertures to fall onto the pins of a base properly positioned thereunder.

BRIEF DESCRIPTION OF THE DRAWINGS

The invention, and the description thereof which follows will be more fully understood when considered together with the figures in which.

DESCRIPTION OF THE PREFERRED EMBODIMENT

Figure 1:
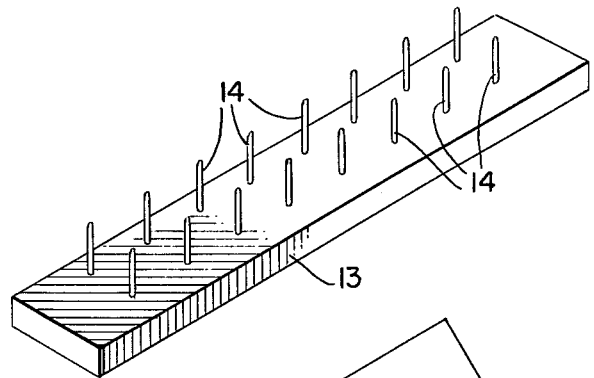
FIG. 1 shows an electrical connector illustrative of the type with which the invention may be used.

The invention has particular utility in the rapid and efficient mounting of solder washers onto the pins of an electrical connector of the type illustrated in FIG. 1. A non-conducting base 13 has mounted on it a plurality of conducting pins 14—14, the pins being usually mounted in a regular fashion perpendicular to the base 13.

Figure 2:
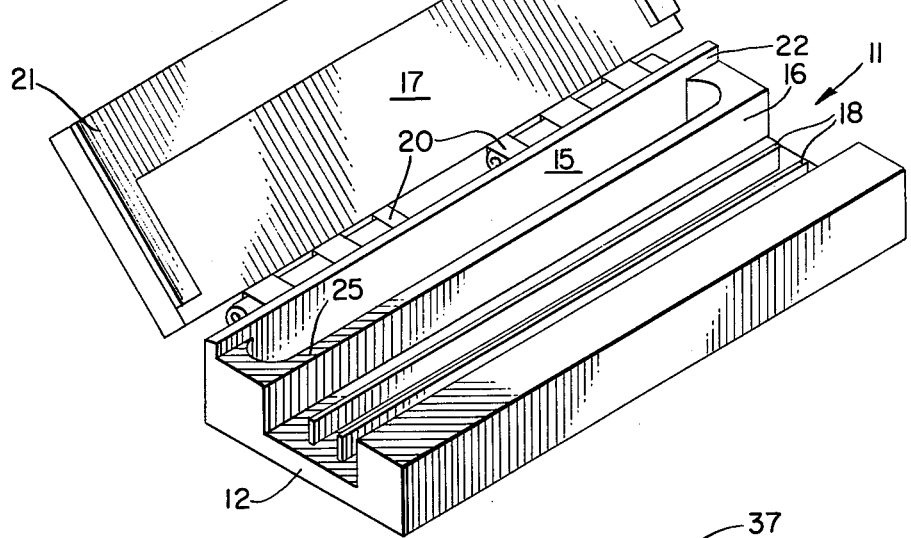
FIG. 2 illustrates a loading apparatus comprising a part of the invention.

Referring to FIG. 2, a preferred loading apparatus 11 is shown. It includes a substantially U-shaped base 12, including a reservoir 15 and a channel 16. A cover 17 is mounted to the base with hinges 20—20. A barrier 21 is secured to the cover such that when the cover is closed on the base, the combination of the raised lip 22 and the barrier 21 effectively seal the periphery of the top of the base 12. A space, however, is left at the top of the wall 25 separating the reservoir 15 from the channel 16.

An optional pair of bracing members 18—18 may be secured within the channel 16 as more fully described below.

Figure 3:
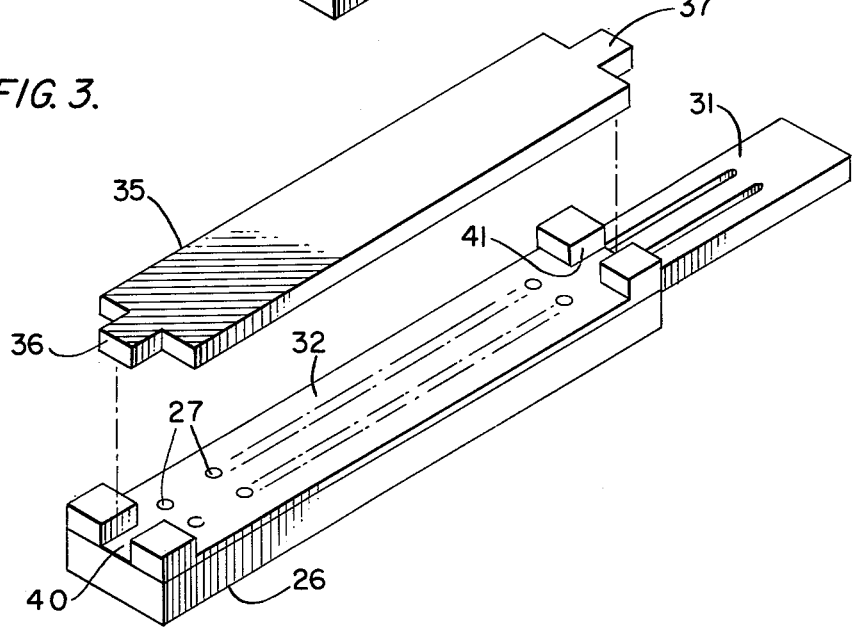
FIG. 3 illustrating a jig to be used with the loading apparatus of FIG. 2.
Figure 6:
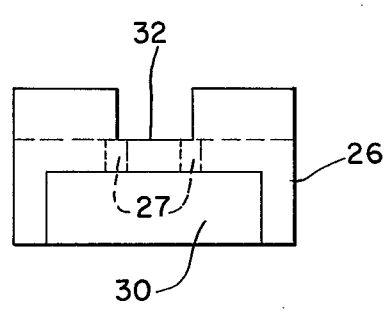
FIG. 6 is an end view of the jig shown in FIG. 3.

Referring to FIG. 3, a jig 26 is constructed with dimensions such that it may be inserted snuggly into the channel 16 of the apparatus of FIG. 2. On the surface 32 of the jig are a plurality of holes 27-27, the holes being regularly spaced on centers coinciding with the centers of the pin arrangement of the electrical connector shown in FIG. 1. As more clearly shown in FIG. 6, the underside of the jig 26 has a channel 30 into which a slide 31 may be snuggly fitted. The channel 30 must extend through at least one end of the jig 26 to admit the slide 31, and must pass under all of the holes 27—27. The depth of these holes, being the distance between the surface 32 of the jig 26 and the channel 30 as shown in FIG. 6, is substantially the height of the number of washers to be stacked upon each pin. A removable insert 35 is constructed to fit flush with the surface 32 of the jig 26. The insert may have a pair of ears 36 and 37 which fit snuggly into grooves 40 and 41 respectfully. When the insert 35 is mounted upon the jig 26 the holes 27—27 are effectively sealed such that any components within the holes are prohibited from falling out when the jig 26 is rotated. As a convenience, latches (not shown) may be applied adjacent to the grooves 40 and 41 to be moved over the ears 36 and 37 to lock the insert 35 in place once the jig 26 is loaded with washers.

Figure 4:
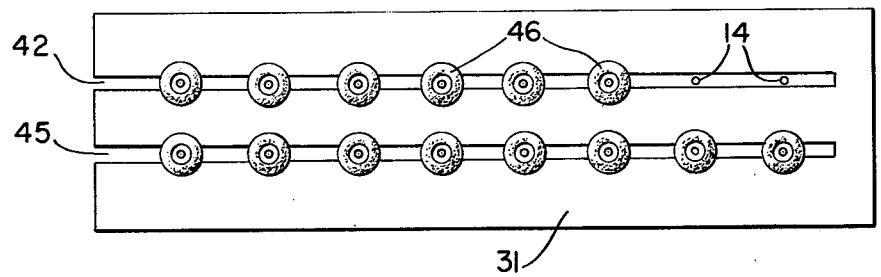
FIG. 4 illustrates a top view of the slide shown in FIG. 3.

Referring to FIG. 4, a top view of the slide 31 is illustrated, together with a necessary size relationship of the solder washers and the pins to be used with the invention. Specifically, the slide 31 has a pair of slots 42 and 45 constructed such that the slide may be mounted upon the electrical connector of FIG. 1 with the pins 14—14 of the connector protruding through the slits. Note that the slits extend all the way to the edge on one end of the slide 31. As is easily seen in FIG. 4, the width of the slits 42 and 45 must be large enough to accommodate the pins 14—14. Further, it is necessary that the width of the slits be sufficiently small that the solder washers 46—46 will not fall through the slits when the washers are inserted onto the protruding pins 14—14. It is necessary, therefore, that the width of the slits 42 and 45 is larger than the outside diameter of the pins 14—14 and smaller than the outside diameter of the solder washers 46—46.

FIG. 6 illustrates an end view of the jig 26. A channel 30 is constructed such that the slide 31 will fit snuggly therein, as shown in FIG. 3. The holes 27—27 extend from the surface 32 of the jig to the channel 30 such that when the slide 31 is inserted into the groove, washers inserted into the holes 27—27 will rest upon the top of the slide 31. As stated previously, the depth of the holes 27—27 is substantially equal to the height of the number of solder washers to be stacked on each pin.

To use the apparatus, the reservoir 15 is first provided with a quantity of solder washers. The slide 31 is inserted into the channel 30 of the jig 26 and the jig is inserted into the channel 16 of the loading apparatus 11. If the optional bracing members 18—18 are present, they should be fitted to fill the slots 42 and 45 of the slide 31 when it is in place in the channel 16. In this way, additional support is provided for the jig 26 during the loading of the washers. The insert 35 is not used at this time. The cover 17 of the loading apparatus is closed and the apparatus is shaken by hand to scatter the washers out of the reservoir and onto the survace 32 of the jig 26 by way of the previously mentioned space above the wall 25. The operator may observe through the clear plastic of the cover 17 when the holes 27—27 of the jig are filled, or are substantially filled, with washers. At that time the cover 17 is lifted and those solder washers remaining on the surface of the jig are pushed into any remaining unfilled holes, or back into the reservoir 15. After observing that all of the holes 27—27 are filled with washers, the operator places the insert 35 onto the surface of the jig to prohibit the washers from falling out of the holes, the jig and slide are removed from the loader. The jig-slide-insert combination is then mounted upon the pins of a connector 13 such that the pins of the connector protrude through the slits of the slide 31 and the holes of the jig 26, to rest against the bottom side of the insert 35. By this process, the pins are also automatically placed through the holes of the solder washers which were previously shaken into the holes of the jig.

Figure 5:
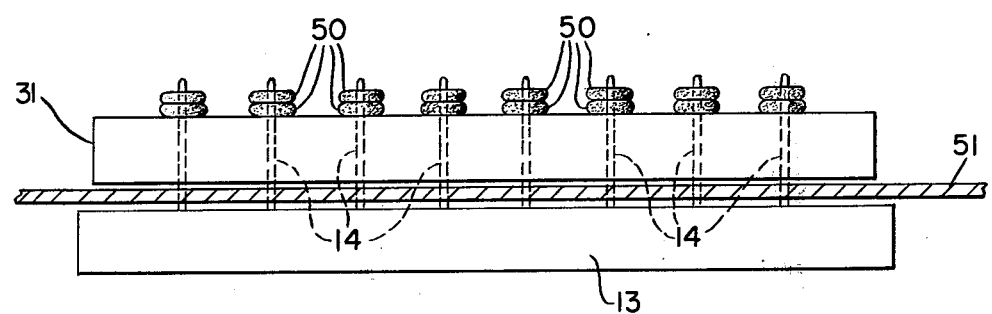
FIG. 5 illustrates certain spatial relationships of various elements utilized in the practice of the invention.

The configuration at this point is shown clearly in FIG. 5. The jig 26 has been omitted from this drawing to more clearly indicate what exists within. The slide 31 is now pulled laterally and removed from the apparatus. This results in the washers 50—50 falling down the pins 14—14 onto the surface of the printed circuit board 51. With the removal of the jig 26, the construction process is completed. All that remains to finish the soldering sequence is to pass a radiant energy source across the surface of the P. C. board to heat and melt the washers, thereby perfecting the electrical connection.

While the foregoing description is of an apparatus for stacking two washers on each pin, it is obvious that more or fewer washers may be stacked by merely changing the depth of the jig. Similarly, various jigs may be provided with different hole spacings to accommodate different pin arrangements. Furthermore, different aperture (hole) shapes and sizes could be provided to accommodate different kinds of components.

What is claimed is:

1. An apparatus for the assembly of components, having a hole therethrough, onto the pins of a structure having a plurality of said pins positioned in a predetermined manner on a base, comprising:
    a jig having extending therethrough a plurality of apertures positioned in an identical pattern to the pattern of said pins, said apertures extending through said jig and having a dimension sufficiently large to admit said components;
    means for loading said components into said apertures; and
    a slideably removable furcated element adapted to fit and disposed below and in contact with said jig, said element having slots formed between said furcations, said slots extending longitudinally from one end of said element to a point near the opposite end of said element and having a width smaller than said components but sufficiently large to admit said pins, thereby preventing said components from falling through said apertures, said slots disposed within said element such that when said element is in place below said jig and said jig and element are placed over said structure and in contact therewith, said pins extend through said slots and said holes of said components, such that when said element is removed by laterally pulling said element from said jig in a direction parallel to said slots, said components retained in said apertures by said element fall onto said pins.

2. The apparatus of claim 1 wherein the depth of the apertures in said jig is substantially equal to the combined height of the number of components to be stacked on each pin.

3. The apparatus of claim 2 wherein the configuration of the apertures is cylindrical and the components are annular in shape.

4. The apparatus of claim 1 wherein said means for loading includes a loading mechanism into which said jig may be inserted, said mechanism including a reservoir for storing a plurality of said components to be loaded into said apertures such that when said loading mechanism is shaken, said components are scattered across the surface of said jig and into said apertures.

5. The apparatus of claim 4 wherein said loading means further includes a cover to confine said components to the surface of said jig.

* * * * *